United States Patent [19]

Ujihara

[11] Patent Number: 5,304,895
[45] Date of Patent: Apr. 19, 1994

[54] ELECTROLUMINESCENT DISPLAY PANEL
[75] Inventor: Takashi Ujihara, Yamagata, Japan
[73] Assignees: Pioneer Electronic Corporation, Tokyo; Tohoku Pioneer Electronic Corporation, Tendo, both of Japan
[21] Appl. No.: 907,979
[22] Filed: Jul. 2, 1992
[30] Foreign Application Priority Data
  Oct. 17, 1991 [JP] Japan .................................. 3-298140
[51] Int. Cl.$^5$ .............................................. G09G 3/10
[52] U.S. Cl. .................................... 315/72; 315/169.3; 313/483; 313/498; 313/505; 240/825.81; 345/76
[58] Field of Search ............... 315/169.3, 72; 313/483, 313/498, 500, 502, 505; 340/781, 825.81
[56] References Cited
  U.S. PATENT DOCUMENTS
  3,258,644  6/1966  Rajchman ........................... 313/205

OTHER PUBLICATIONS

Dove et al. "Large Area Electroluminescent Panel" IBM Technical Disclosure Bulletin vol. 21, No. 10 Mar. 1979, pp. 4261-4263.

Primary Examiner—Robert J. Pascal
Assistant Examiner—Michael B. Shingleton
Attorney, Agent, or Firm—Nikaido, Marmelstein, Murray & Oram

[57] ABSTRACT

An EL display panel comprises a plurality of insulating substrates which are aligned side by side. Each substrate has an elongated first side surface and an opposite second side surface, a plurality of discrete electrodes formed on the first side surface, a common electrode formed on the second side surface, and a plurality of luminescent elements formed on a top surface of the substrate. The discrete electrodes of the adjacent substrates are electrically connected with each other.

2 Claims, 5 Drawing Sheets

ELECTROLUMINESCENT DISPLAY PANEL

BACKGROUND OF THE INVENTION

The present invention relates to an enlarged display panel having electroluminescent (EL) elements.

The electroluminescent display having fluorescent substance which emits light upon application of electric field is superior than a liquid crystal display in visibility and resolution. An organic fluorescent substance emits light with much lower voltage than an inorganic fluorescent substance such as zinc sulfide and calsium sulfide, so that the display may be driven by an ordinary integrated circuit.

Referring to FIG. 1, a conventional electroluminescent display panel has a glass substrate 1 on which a layer of indium-tin oxide (ITO) is deposited by chemical vapor deposition or vapor deposition to form a plurality of transparent electrode strips 2. On the transparent electrodes 2, a thick luminescent layer 4 of about severals tens of μmm is disposed by screen printing, interposing a first insulating layer 3. The layer 4 may be a thin film formed by various deposition methods. A plurality of opposite electrode strips 6 are formed on the luminescent layer 4, interposing a second insulating layer 5 therebetween.

The opposite electrode 6 and the transparent electrodes 2 are disposed to extend in perpendicular directions to each other, thereby forming an X-Y dot matrix. In an active matrix display, either one of the X-ordinate and Y-ordinate serves as a scanning electrode array and the other serves as a data electrode array, each of which is driven by an IC.

When one of the transparent electrodes 2i and one of the opposite electrodes 6j are applied with a current, a pixel 4ij comprising the luminescent layer 4 at the coordinates (i,j) on the X-Y matrix is energized to illuminate it. Thus, an image is indicated on the display.

Various devices such as the IC are attached to the EL display panel to produce a display device. The product device undergoes various tests concerning exterior, displaying operation, reliability and mechanical strength of the panel. However, since each pixel has extremely delicate and complicated structure, a large portion of the matrix panel is proved to be defective by the tests. Thus, the yield of the production is small.

More particularly, supposing that one pixel per 10,000 pixels is defective, and the matrix panel comprises 280 by 120 pixels, the rate the defective matrix panel is manufactured is, $$(280 \times 120) \times (1 \times 10,000) = 0.33$$

Namely, one per three EL matrix panels is effective. The yield further decreases if the panel is provided with a thin film transistor (TFT) to impart a memory function thereto.

If the manufacturing process is strictly supervised for improving the yield, the cost of the EL panel inevitably increases. Moreover, a low yield makes it difficult to manufacture a larger EL display panel where a large number of pixels are used. Since the large EL panel requires various complicated examining processes, the manufacturing cost further rises.

SUMMARY OF THE INVENTION

An object of the present invention is to provide a reliable EL display panel, a plurality of which can be used for a large EL display panel.

According to the present invention, there is provided an EL display panel comprising a plurality of insulating substrates which are aligned side by side, each substrate having an elongated first side surface and an opposite second side surface, a plurality of discrete electrodes formed on the first side surface and aligned in a longitudinal direction of the side, a common electrode formed on the second side surface, and a plurality of luminescent elements formed on a top surface of the substrate, each luminescent element comprising a metal electrode, a luminescent layer on the metal electrode, and a transparent electrode on the luminescent layer, the metal electrode being connected to one of the discrete electrodes and the transparent electrode being connected to the common electrode. The insulating substrates are so disposed in an array that the first side surface of the substrate and the second side surface of the adjacent substrate are faced with each other. The discrete electrodes of the adjacent substrates are electrically connected with each other.

In an aspect of the invention, a thin film transistor which is connected to the common electrode and the discrete electrode is provided on the second side surface of the substrate, so as to provide a memory function in the electroluminescent display panel.

Accordingly the luminescent elements on the surface of the insulating substrates are aligned in X and Y ordinates, thereby forming an X-Y dot matrix panel. Each row of discrete electrodes connected to each other and each common electrode are connected to an X-ordinate driving circuit and to a Y-ordinate driving circuit, respectively, so that the luminescent elements operates as pixels, thereby providing a two-dimensional display panel.

The other objects and features of this invention will become understood from the following description with reference to the accompanying drawings.

DETAILED DESCRIPTION OF THE PREFERRED EMBODIMENT

Figure 1:
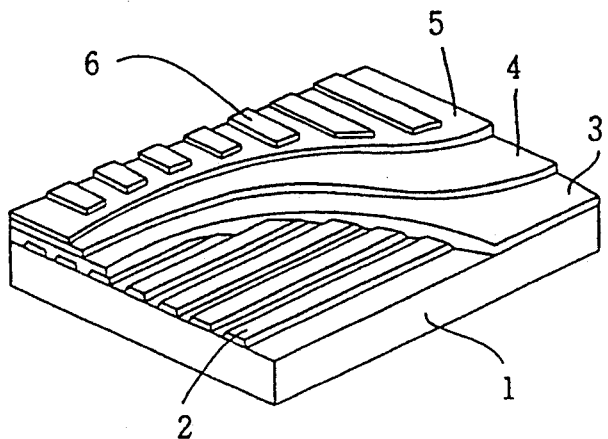
FIG. 1 is a perspective view showing a conventional electroluminescent display panel.
Figure 2:
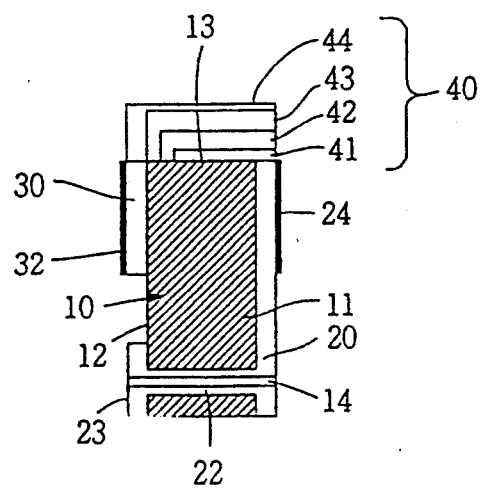
FIG. 2 is a sectional view of a substrate of an electroluminescent display unit according to the present invention.
Figure 3:
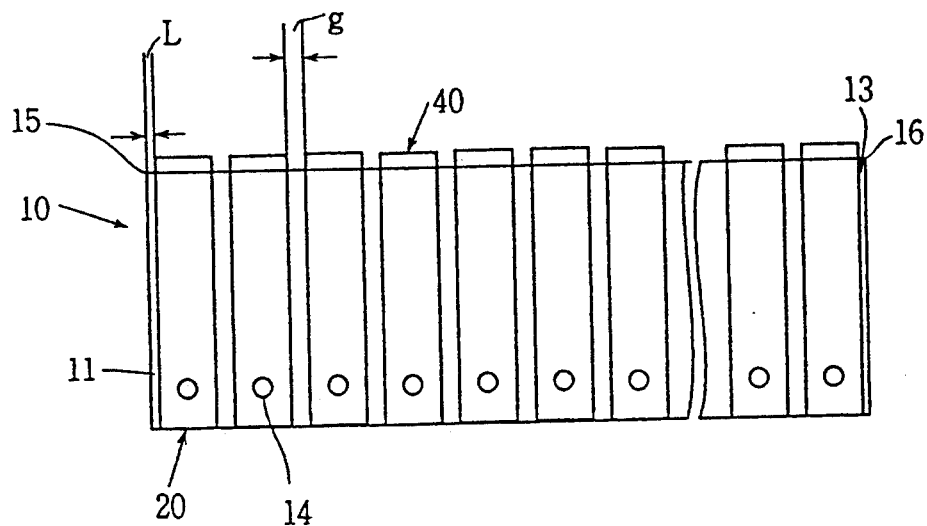
FIGS. 3 and 4 are elevational side views of the substrate showing a first surface and a second surface, respectively.
Figure 4:
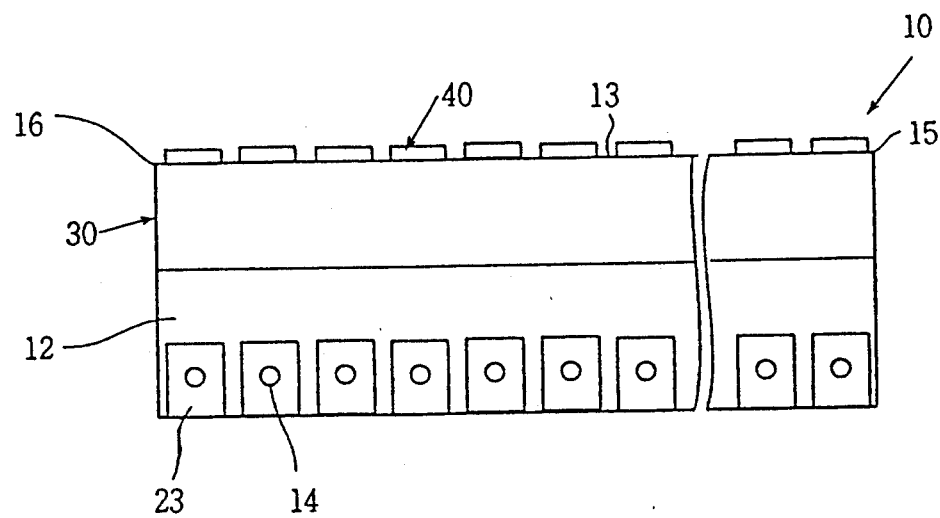

An electroluminescent display panel according to the present invention comprises a plurality of insulating substrate 10 made of polyimide resin which has good moldability, durability and stability in its shape. Referring to FIGS. 2 to 4, on a first side surface 11 of the substrate 10, a plurality of discrete electrodes 20 are mounted, and on a second side surface 12 opposite the first side surface 11, a lateral common electrode 30 is disposed on an upper portion thereof. A plurality of conductive layers 23, each of which corresponds to the discrete electrodes 20 are formed on a bottom portion of the second surface 12 of the substrate 10 below the common electrode 30. A plurality of trans-throughholes 14 are formed in a lower portion of the substrate 10. Each throughhole 14 is opened at the corresponding electrode 20 and layer 23, and lined with a conductive layer 22 so that each discrete electrode 20 is connected with the corresponding conductive layer 23. An upper portion of each discrete electrode 20 and the entire area of the common electrode 30 are covered with insulating layers 24 and 32, respectively, as shown in FIG. 2. In FIGS. 3 and 4, the insulating layers 24 and 32 are omitted. Thus, when the substrates 10 are aligned side by side to form a display panel, the electrodes 20 and 30 of the adjacent substrates 10 are prevented from short-circuiting with each other. If the electrode on one of the sides is sufficiently insulated, the insulating layer on the other side may be omitted.

The electrodes 20 and 30 and the conductive layer 22 are formed by appropriate methods such as electrodeposition, sputtering and vacuum deposition.

Formed on a top surface 13 of the substrate 10 are a plurality of luminescent elements 40 as pixels. Each of the luminescent elements 40 comprises a metal electrode 41 connected to the discrete electrode 20, luminescent layer 42, Hall effect isolator 43 for effectively transmitting light of the luminescent layer 42 and a transparent electrode 44 connected to the common electrode 30. Each layer is sequentially mounted on the top of the last on the substrate 10.

The metal electrode layer 41 is made of a conductive material such as aluminum magnesium. The luminescent layer 42 comprises an organic luminescent material such as 8-qhinolinol-aluminum complex, or a derivative of triphenyldiamine doped with an appropriate quantity of phosphorscent pigment. The transparent electrode 44 is made of indium-tin oxide (ITO).

Each layer of the luminescent element 40 is precipitated by a method such as electrodeposition, chemical vapor deposition, physical vapor deposition or sputtering. The luminescent elements 40 are thus laminated to form an overall thickness of about 1 μm. Those elements 40 are disposed in an array on the top surface 13 of the substrate 10 at an interval of 0.2 mm, which is shown as a distance g in FIG. 3.

Figure 5:
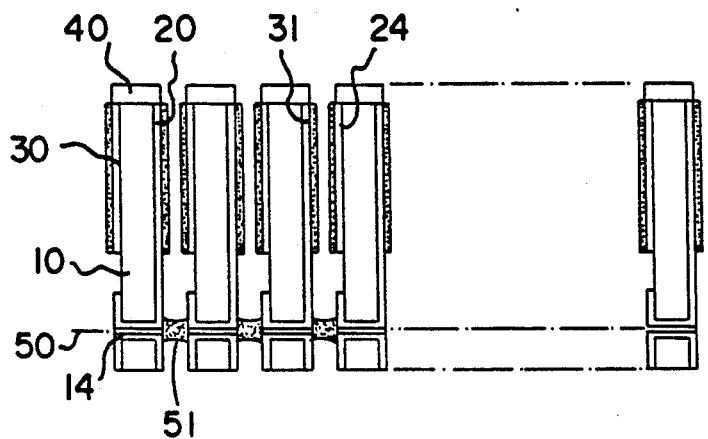
FIG. 5 is an elevation showing an array of the substrates of FIG. 2.

In order to manufacture an EL display panel, the insulating substrates 10 are so aligned to dispose the luminescent elements 40 in flush with one another as shown in FIG. 5. A lead 50 is inserted in each alignment of the throughholes 14 and connected to the discrete electrodes 20 through solders 51 so that discrete electrodes 20 in the same row are connected. Alternatively, an anisotropic conductive film may be interposed between the adjacent substrates 10 which are tightly pressed against each other, in which case the leads 50 except for those extending from an end substrate may be omitted.

As a result, the metal electrode layers 41 of the luminescent element 40 belonging to the same row are connected through the discrete electrodes 20 and the leads 50, thereby maintaining the same potential. On the other hand, the transparent electrode layers 44 of each substrate 10 are connected through the common electrode 30 to maintain the same potential. The insulating layers 24 and 32 prevent a shortcircuit between opposing discrete electrode 20 and the common electrode 30.

Figure 6:
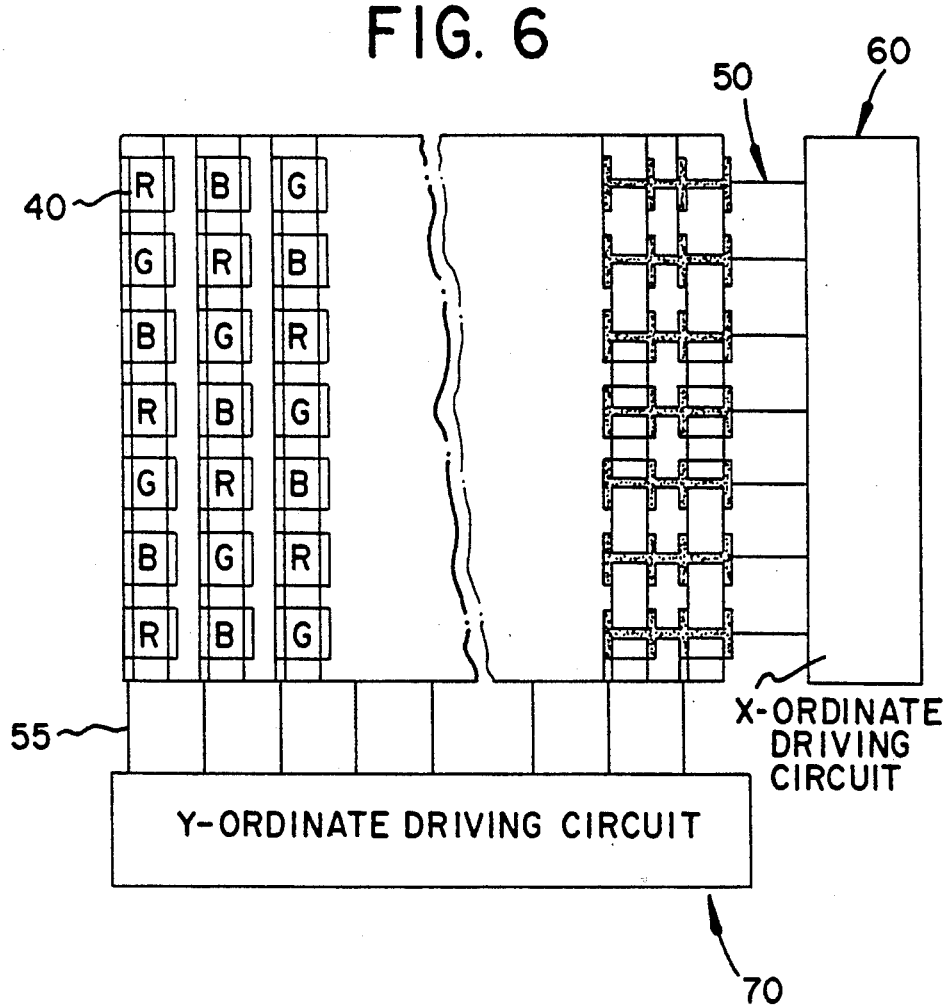
FIG. 6 is a schematic plan view of an X-Y dot matrix as an electroluminescent display panel.

As shown in FIG. 6, each lead 50 extended from the throughhole 14 of the end substrate 10 are connected to an X-ordinate driving circuit 60. Leads 55 connected to the common electrodes 30 are connected to a Y-ordinate driving circuit 70. If m substrates 10, each having n luminescent elements 40, are aligned, an X-Y dot matrix having n x m luminescent elements 40 is formed One of the X- and Y- ordinates is designated as a scanning electrode, and the other is designated as a signal electrode. When the luminescent elements 40 are energized through the driving circuits 60 and 70, an image is displayed on the X-Y dot matrix by a line-at-a-time scanning scheme.

The tops of the luminescent elements need not be perfectly in flush with each other. The substrates 10 may be slightly out of alignment so as to form a curved displaying surface, which is preferable for a large display panel.

In order to form a color display panel, green, red and blue pixels must be systematically arranged on the panel. For example, three types of substrates 10, each having luminescent elements 40 for green, red and blue cyclically repeated, are arranged by shifting the phase by one pitch as shown in FIG. 6.

Before the assembling of the EL display panel of the present invention, each substrate 10 is tested for operation of the electroluminescent elements 40. Since only the substrates that passed the test are assembled, extremely reliable EL display is easily manufactured. As a result, the yield of the product is drastically improved, thereby decreasing the manufacturing cost.

Figure 9:
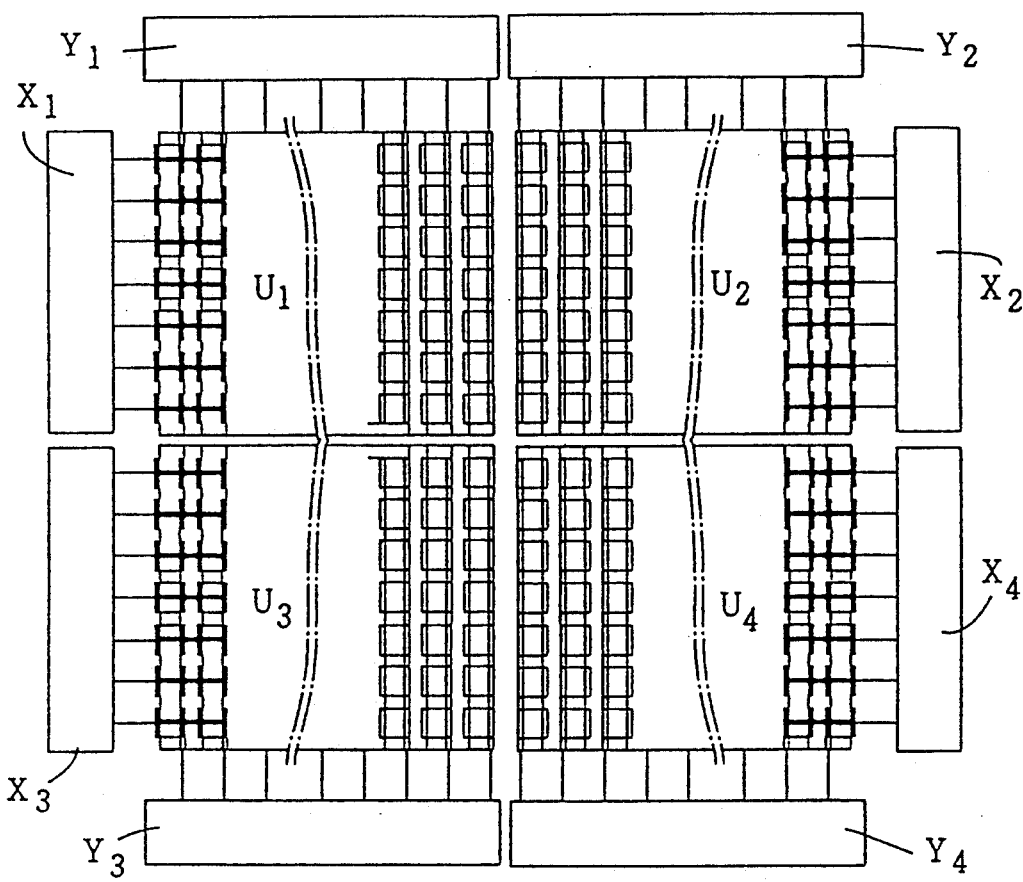
FIG. 9 is a plan view of an electroluminescent display panel comprising four X-Y dot matrix unit of FIG. 6.

Several units of the thus manufactured EL display panel may be connected to form a larger multiple EL display panel. If two panel units are connected, the number of pixels is $2n \times m$ or $n \times 2m$. When four display panel units U1 to U4 are connected as shown in FIG. 9, the assembled display panel has $2n \times 2m$ pixels so that the area of the panel is four times as large as that of each unit.

Such an arrangement is possible because the luminescent elements 40 can be formed along the edges 15 and 16 of the substrate 10, leaving only a very small distance between the edge and the element as shown in FIG. 3. More particularly, when the distance L between the edge of the luminescent element 40 and the edge 15 of the substrate 10 is one-half of that of the distance g between adjacent elements 40, the pixels are equidistantly disposed on the X-ordinate. On the other hand, in order to equally dispose the pixels on the Y-ordinate, an insulating film having a proper thickness is interposed between the innermost substrate of the units U1 and U3 and between units U2 and U4.

In the multiple display panel, the driving circuits X1 to X4 and Y1 to Y4 are disposed around the four sides of the panel. The scanning signal and data signal are applied to the circuits X1 to X4 and Y1 to Y4 by time sharing.

Figure 7:
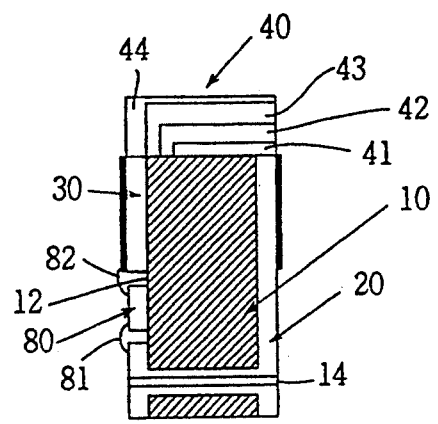
FIG. 7 is a sectional view of a substrate for an electroluminescent display panel of a second embodiment of the present invention.
Figure 8:
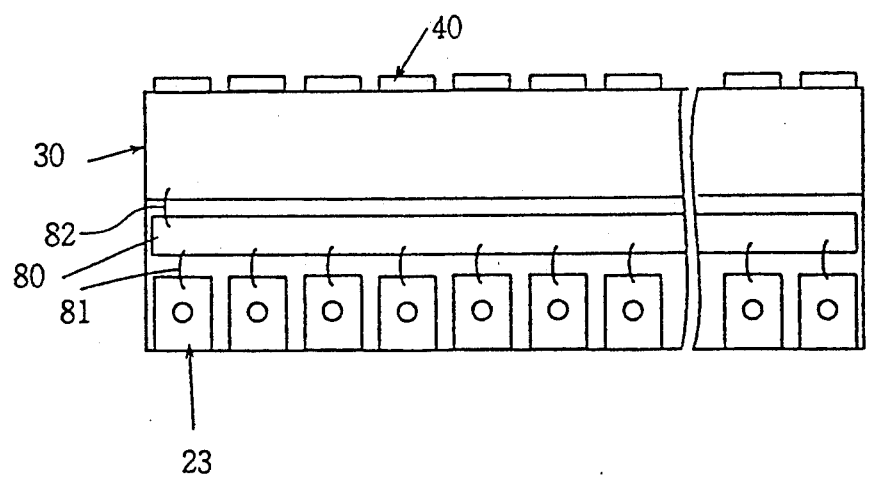
FIG. 8 is an elevational side view of the substrate of FIG. 7.

Referring to FIGS. 7 and 8, in the second embodiment of the present invention, which has a memory function, a plurality of thin film transistors (TFT) 80 normally employed for a conventional liquid crystal display panel and EL display panel are mounted on the second side surface 12 of the insulating substrate 10 between the common electorode 30 and the array of conductive layer 23. As is well known, the TFT is provided at every pixel and comprises a first TFT and a second TFT. The gate of the first TFT is connected to the common electrode 30, the drain is connected to the discrete electrode 20, and the source is connected to a capacitor and the gate of the second TFT. The drain of the second TFT is connected to the electrode 41. Reference numerals 81 and 82 are bonding wires for the connections.

In operation, when coordinates x, y are selected so that the discrete electrode 20x and common electrodes 30y are energized through the X- and Y-ordinate driving circuits 60 and 70, a pulse current is generated at the intersection (x,y) of the X- and Y-ordinates. As a result, the first TFT connected to the metal electrode layer 41 is rendered conductive, thereby charging the capacitor. The charged voltage of the capacitor depends on a pulse width of the pulse current applied to the gate from the common electrode 30. When the charged voltage is sufficient, the second TFT becomes conductive. Thus, the voltage is applied to the electrode 41 to operate the luminescent element 40. As the capacitor is discharged, the voltage at the gate of the second TFT gradually decreases. When the voltage becomes lower than a threshold voltage, the illumination of the luminescent layer 42 stops. The time during which the second TFT is conductive, and hence the illuminating time of luminescent layer 42, depends on the charge voltage of the capacitor. The same memory function can be obtained by mounting a photoconductive layer such as a-Sic:H on the luminescent element 40.

Figure 10:
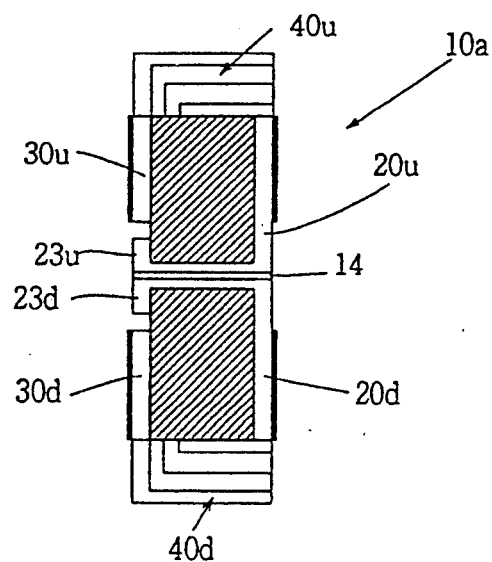
FIG. 10 is a sectional view of a substrate of a third embodiment of the present invention.

FIG. 10 shows the third embodiment of the present invention where an insulating substrate 10a, the height of which is preferably less than 10 mm, has upper and lower luminescent elements 40u and 40d on the top and the bottom surface thereof. On one side surface of the substrate 10a, upper and lower discrete electrodes 20u and 20d are mounted, and on the opposite side surface, upper and lower common electrodes 30u and 30d are mounted. The throughholes 14 are formed in the center portion of the substrate 10 and the upper and lower conductive layers 23u and 23d are formed on the second side surface of the substrate 10a so as to be connected to the electrodes 20u and 20d through the throughhole 14. Thus a double-sided display panel can be provided.

In accordance with the present invention, although an extra connecting process of the substrates is needed in manufacturing the EL display panel, a substrate having a defective pixel can be checked before the process so that the rate of the defective panel product is extremely decreased.

More particularly, if the defective pixel is one per 10,000 pixels, the rate of the occurrence of defective substrate each having 280 pixels is as follows.

$$280 \times 1/10000 = 0.028$$

Namely, less than three per 100 substrates are defective. Since various tests can be carried out on each of the 280 pixels at one time, the checking operation can be simplified.

The size of the display panel can be freely designed by determining the number of the pixels on each substrate and the number of the substrates. Moreover, a large display panel can be manufactured by connecting a plurality of display panel units without much increasing the manufacturing process. Since the pixels is formed near the edge portions of the panel unit, the distance between end pixels of the adjacent panel units can be set to the same distance as that between other pixels. Thus, the reliability of the panel is not reduced.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. An electroluminescent display panel, comprising:
   a plurality of insulating substrates which are aligned side by side;
   each of the substrates having an elongated first side surface, an opposite second side surface, and an end surface, with a plurality of discrete electrodes formed on the first side surface and aligned in a longitudinal direction of the first side surface, a common electrode formed on the second side surface, a plurality of luminescent elements formed on the end surface of the substrate, and a plurality of throughholes formed in the substrate, each throughhole passing through one of said discrete electrodes and said substrate;
   each luminescent element of said plurality of luminescent elements comprising a metal electrode connected to a corresponding one discrete electrode of said plurality of discrete electrodes, a luminescent layer disposed on the metal electrode, and a transparent electrode on the luminescent layer, said transparent electrode being connected to said common electrode;
   wherein corresponding discrete electrodes of the adjacent substrates of said plurality of substrates form rows of discrete electrodes of separate substrates, and wherein discrete electrodes in a same row are electrically connected with each other by a lead penetrating each throughhole corresponding to discrete electrodes in the same row.

2. An electroluminescent display panel according to claim 1, further comprising a plurality of thin film transistors disposed on each of said substrates, at least one thin film transistor of said plurality of thin film transistors being connected to the common electrode and one discrete electrode of said plurality of discrete electrodes and being provided on the second side surface of each substrate.

* * * * *